US009419588B1

(12) United States Patent
Hsu (10) Patent No.: US 9,419,588 B1
(45) Date of Patent: Aug. 16, 2016

(54) OUTPUT DRIVER HAVING OUTPUT IMPEDANCE ADAPTABLE TO SUPPLY VOLTAGE AND METHOD OF USE (71) Applicant: Integrated Device Technology, Inc., San Jose, CA (US)

(72) Inventor: John Hsu, Sunnyvale, CA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 14/628,215

(22) Filed: Feb. 21, 2015

(51) Int. Cl.
*H03K 3/01* (2006.01)
*H03K 3/012* (2006.01)

(52) U.S. Cl.
CPC . *H03K 3/01* (2013.01); *H03K 3/012* (2013.01)

(58) Field of Classification Search
CPC ..... H03K 3/011; H03K 3/012; H03K 17/002; H03K 17/04; H03K 17/9622; H03K 19/01; H03K 19/005
USPC ............ 327/108, 109, 110, 111, 112; 326/80, 326/81, 82, 83
See application file for complete search history.

(56) References Cited

U.S. PATENT DOCUMENTS

| | | | |
|---|---|---|---|
| 5,426,383 A | 6/1995 | Kumar et al. | |
| 6,054,881 A | 4/2000 | Stoenner | |
| 6,329,836 B1 | 12/2001 | Drost et al. | |
| 6,836,143 B2 | 12/2004 | Song et al. | |
| 7,385,414 B2 | 6/2008 | Kim et al. | |
| 7,741,866 B2 | 6/2010 | Krishnan et al. | |
| 8,570,063 B2 * | 10/2013 | Grunzke ........ | H03K 19/018571 326/30 |
| 2002/0053923 A1 | 5/2002 | Kim et al. | |
| 2003/0122593 A1 | 7/2003 | Volk et al. | |
| 2004/0119497 A1 | 6/2004 | Roy et al. | |
| 2006/0066354 A1 | 3/2006 | Isik et al. | |
| 2008/0106301 A1 | 5/2008 | Fukushi | |
| 2010/0033210 A1 | 2/2010 | Baek et al. | |
| 2014/0159769 A1 | 6/2014 | Hong et al. | |

OTHER PUBLICATIONS

Boni, et al., "LVDS I/O Interface for Gb/s-per-Pin Operation in 0.35-um CMOS", IEEE Journal of Solid State Circuits, vol. 36, No. 4, Apr. 2001, pp. 1-6.

* cited by examiner

*Primary Examiner* — John Poos
(74) *Attorney, Agent, or Firm* — Kenneth Glass; Molly Sauter; Glass & Associates (57) ABSTRACT

An output driver is provided that adapts an output impedance of the output driver to the voltage level of a power supply, thereby providing a constant output impedance over a range of different operating voltages. The output driver includes a plurality of individual driver circuits, each one of the plurality of individual driver circuits configured to provide a plurality of predetermined output impedances in response to a plurality of power supply voltage level inputs and a decoder. The decoder of the output driver is configured for receiving a digital codeword representative of a voltage level of a power supply coupled to the output driver and for decoding the digital codeword to activate one or more of the individual driver circuits to provide a constant output impedance from the output driver in response to the voltage level of the power supply coupled to the output driver, wherein the constant output impedance is a combination of the predetermined output impedances of the activated individual driver circuits.

16 Claims, 5 Drawing Sheets

_OUTPUT DRIVER HAVING OUTPUT
IMPEDANCE ADAPTABLE TO SUPPLY
VOLTAGE AND METHOD OF USE_

FIELD OF THE INVENTION

This invention relates to integrated circuits comprising an output driver having an adaptable output impedance that is dependent upon the voltage level input of a supply voltage.

BACKGROUND OF THE INVENTION

An output driver is a common element of a semiconductor device that is typically used for storing a binary value and for communicating the binary value to other circuitry throughout the semiconductor device over a data bus. At the output driver, a voltage level represents the binary value and it is common to connect an output driver to a transmission line of the semiconductor device for communicating the binary value to a receiving circuit by driving the transmission line to a desired voltage level, representative of the binary value. When driving the transmission line, the output driver exhibits an inherent output impedance. The transmission line also has an inherent characteristic impedance. When the output impedance of the output driver is not matched to the characteristic impedance of the transmission line, transmission line reflections occur which limit the high-speed I/O performance of the integrated circuit. These reflections can be controlled by matching the driver output impedance to the impedance of the transmission line, thereby obtaining a desired high rate of data transfer on the transmission line. Impedance matching solutions currently known in the art require the use of off-chip components, such as resistors, or techniques for programming the driver output impedance from outside the integrated circuit chip to implement matching between the output driver and the transmission line. However, these solutions adversely impact board density, reliability and cost of the device.

The output impedance of the output driver is dependent upon many factors, including the voltage level input of the supply voltage of the integrated circuit. Various operating voltages may be employed in integrated circuit board designs and the output impedance of an output driver implemented in the integrated circuit may change based upon the specific operating voltage used in the circuit design. In particular, integrated circuits, such as low-voltage complementary metal oxide (LVCMOS) circuits, are commonly designed for operating voltages of 3.3V, 2.5V or 1.8V. An output driver implemented in an integrated circuit with an operating voltage of 3.3V will exhibit a different output impedance than the same output driver implemented in an integrated circuit with an operating voltage of 2.5V. As such, a circuit designer will be unable to use the same output driver for different operating voltages without making adjustments to the integrated board design to account for the impedance mismatch.

Accordingly, what is needed in the art is an improved output driver that adapts its output impedance to the voltage level of a given power supply to provide a constant output impedance over a range of different operating voltages.

SUMMARY

In various embodiments, the invention includes an output driver that adjusts to the voltage level of a power supply input to provide the same output impedance over a range of different power supply voltage level inputs.

In one embodiment, the invention includes an output driver to provide a constant output impedance in response to a plurality of different power supply voltage level inputs. The output driver includes a plurality of individual driver circuits, each one of the plurality of individual driver circuits configured to provide a plurality of predetermined output impedances in response to a plurality of power supply voltage level inputs. The output driver further includes a decoder coupled to each of the plurality of individual driver circuits, the decoder for receiving a digital codeword representative of a voltage level of a power supply coupled to the output driver, for decoding the digital codeword and for activating one or more of the individual driver circuits based upon the decoded digital codeword, the activation of the one more individual driver circuits to provide a constant output impedance from the output driver in response to the voltage level of the power supply coupled to the output driver, wherein the constant output impedance is a combination of the predetermined output impedances of the activated individual driver circuits.

In one embodiment, the constant output impedance from the output driver is a summation of the predetermined output impedances of each of the activated one or more individual driver circuits.

In an additional embodiment, the output driver is implemented in an integrated circuit device for providing a constant output impedance in response to a plurality of different power supply voltage level inputs. In this embodiment, the device includes a voltage sensor and an output driver coupled to the voltage sensor. The voltage sensor is configured for sensing the voltage level of a power supply coupled to the output driver and for converting the voltage level to a digital codeword representative of the voltage level of the power supply. The output driver includes a plurality of individual driver circuits, each one of the plurality of individual driver circuits configured to provide a plurality of predetermined output impedances in response to a plurality of power supply voltage level inputs. The output driver further includes a decoder coupled to each of the plurality of individual driver circuits and to the voltage sensor, the decoder for receiving the digital codeword from the voltage sensor, for decoding the digital codeword and for activating one or more of the individual driver circuits based upon the decoded digital codeword, the activation of the one more individual driver circuits to provide a constant output impedance from the output driver in response to the voltage level of the power supply coupled to the output driver, wherein the constant output impedance is a combination of the predetermined output impedances of the activated individual driver circuits.

In an additional embodiment, the present invention includes a method for providing a constant output impedance of an output driver in response to a plurality of different power supply voltage levels. The method includes, sensing a voltage level of a power supply coupled to an output driver and converting the sensed voltage level of the power supply to a digital codeword representative of the voltage level of the power supply. The method further includes, receiving the digital codeword at a decoder of the output driver, wherein the output driver includes a plurality of individual driver circuits, and decoding the digital codeword at the decoder to activate one or more of the plurality of individual driver circuits based upon the decoded digital codeword, the activation of the one more individual driver circuits to provide a constant output impedance from the output driver in response to the voltage level of the power supply coupled to the output driver.

In a specific embodiment, each of the plurality of individual driver circuits are configured to provide a plurality of predetermined output impedances in response to a plurality of power supply voltage level inputs and the constant output impedance from the output driver is a summation of the predetermined output impedances of each of the activated one or more individual driver circuits.

In accordance with the present invention, an improved system and method are described for an output driver having a output impedance that is adaptable to a given supply voltage, thereby providing a constant output impedance from an output driver in response to a range of supply voltage level inputs.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION

In operation of an integrated circuit is provided, an improved output driver that adapts to the voltage level of the power supply, thereby providing the same output impedance from the output driver over a range of different operating voltages.

Figure 1:
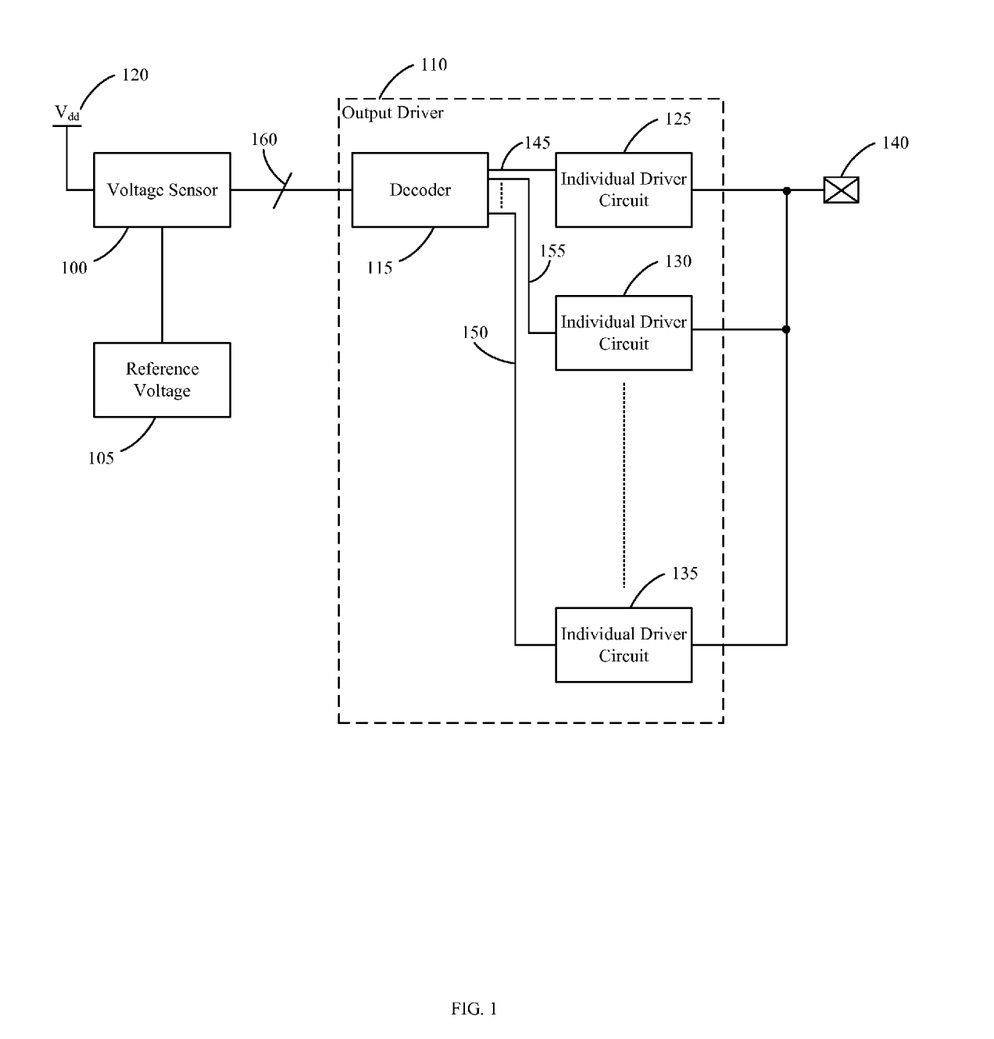
FIG. 1 is a diagrammatic view of an output driver and associated supporting circuitry in accordance with an embodiment of the present invention.

With reference to FIG. 1, the output driver 110 includes a decoder 115 and a plurality of individual driver circuits 125, 130, 135. In one embodiment the individual driver circuits 125, 130, 135 are LVCMOS driver circuits comprising LVCMOS elements. An input of each of the individual driver circuits 125, 130, 135 is coupled to an individual output 145, 150, 155 of the decoder 115 and an output of each of the individual driver circuits 125, 130, 135 is coupled to a semiconductor pad 140 that may be coupled to a data bus or transmission line external to the output driver 110. In operation, the output driver 110 is coupled to the data bus through the semiconductor pad 140 and the output driver 110 drives a voltage on the transmission line to transmit data along the transmission line to a receiver.

Each of the individual driver circuits 125, 130, 135 of the output driver 110 are configured to provide a plurality of predetermined output impedances in response to a plurality of power supply voltage level inputs. It is known in the art that the output impedance of a driver circuit changes based upon the voltage level of the power supply or operating voltage. Additionally, process variations in the production of the transistor elements of the driver circuits may affect the output impedance of the output driver 110. In one embodiment of the present invention, lab measurements are taken of the output impedance each of the individual driver circuits 125, 130, 135 under a plurality of different power supply voltage levels to identify the output impedance of the individual driver circuits 125, 130, 135 in response to each of the different power supply voltage levels. In an additional embodiment, computer modeling techniques are used to estimate the output impedance of each of the individual driver circuits 125, 130, 135 under the plurality of different power supply voltage levels. These measurements or estimations of the output impedances are then used to establish the plurality of predetermined output impedances in response to the plurality of power supply voltage level inputs for each of the individual driver circuits 125, 130, 135.

In general, the output impedance of a driver circuit decreases as the voltage level of the supply voltage decreases. As such, for voltage levels of 3.3V, 2.5V and 1.8V, which are commonly used in LVCMOS technology, the output impedance of the individual driver circuits 125, 130, 135 will be at a highest level when the driver circuits 125, 130, 135 are operating at 3.3V and will decrease as the operating voltage is decreased from 2.5V to 1.8V. The output impedances of the individual driver circuits 125, 130, 135, in response to each of the power supply voltage levels, may be the same or different, based upon the specific circuit elements and the processing conditions of the circuit elements of each of the individual driver circuits 125, 130, 135.

The outputs of the individual driver circuits 125, 130, 135 are tied to a common pad 140 to provide the total output impedance for the output driver 110 and as such, the output impedance of the output driver 110 is a combination of the output impedances of each of the individual driver circuits 125, 130, 135 that are activated to drive the transmission line at the common pad 140. In order to adapt the output impedance of the output driver 110 to the supply voltage currently being used to drive the output driver circuitry and to therefore provide a constant output impedance from the output driver 110 under different supply voltages, it is necessary to select the appropriate combination of individual driver circuits 125, 130, 135 for each of the different supply voltages that provides the constant output impedance as a combination of the output impedances of the individual driver circuits 125, 130, 135.

In order to select the appropriate combination of individual driver circuits 125, 130, 135 that will provide a desired output impedance for the output driver at a given supply voltage, the output driver includes a decoder 115. The output of the decoder 115 is coupled to each of the plurality of individual driver circuits 125, 130, 135. The decoder 115 is configured to receive a digital codeword 160 representative of a voltage level of a power supply 120 coupled to the output driver. The decoder 115 is further configured for decoding the digital codeword 160 and for activating one or more of the individual driver circuits 125, 130, 135 based upon the decoded digital codeword 160. The activation of the one or more individual driver circuits 125, 130, 135 provides a constant output impedance from the output driver 115 in response to the voltage level of the power supply 120 coupled to the output driver, wherein the constant output impedance is a combination of the predetermined output impedances of the activated individual driver circuits 125, 130, 135. The output impedance of each of the activated individual driver circuits 125, 130, 135 contributes to the output impedance of the output driver 110 and individual driver circuits 125, 130, 135 are activated such that the same output impedance of the output driver 110 is realized, regardless of the supply voltage. In a particular embodiment, the constant output impedance of the output driver 110 is a summation of the predetermined output impedances of each of the activated one or more individual driver circuits 125, 130, 135.

In one embodiment, a voltage sensor 100 coupled to the decoder 115 provides the digital codeword 160 used to activate the individual driver circuits 125, 130, 135. The voltage sensor 100 compares the supply voltage 120 to a reference voltage 105 to convert the supply voltage 120 to a digital codeword 160 that represents the voltage level of the supply voltage 120, as is commonly known in the art. In a specific embodiment, the voltage sensor 100 is an analog-to-digital (A/D) converter and the reference voltage 105 is a bandgap reference voltage.

Figure 2:
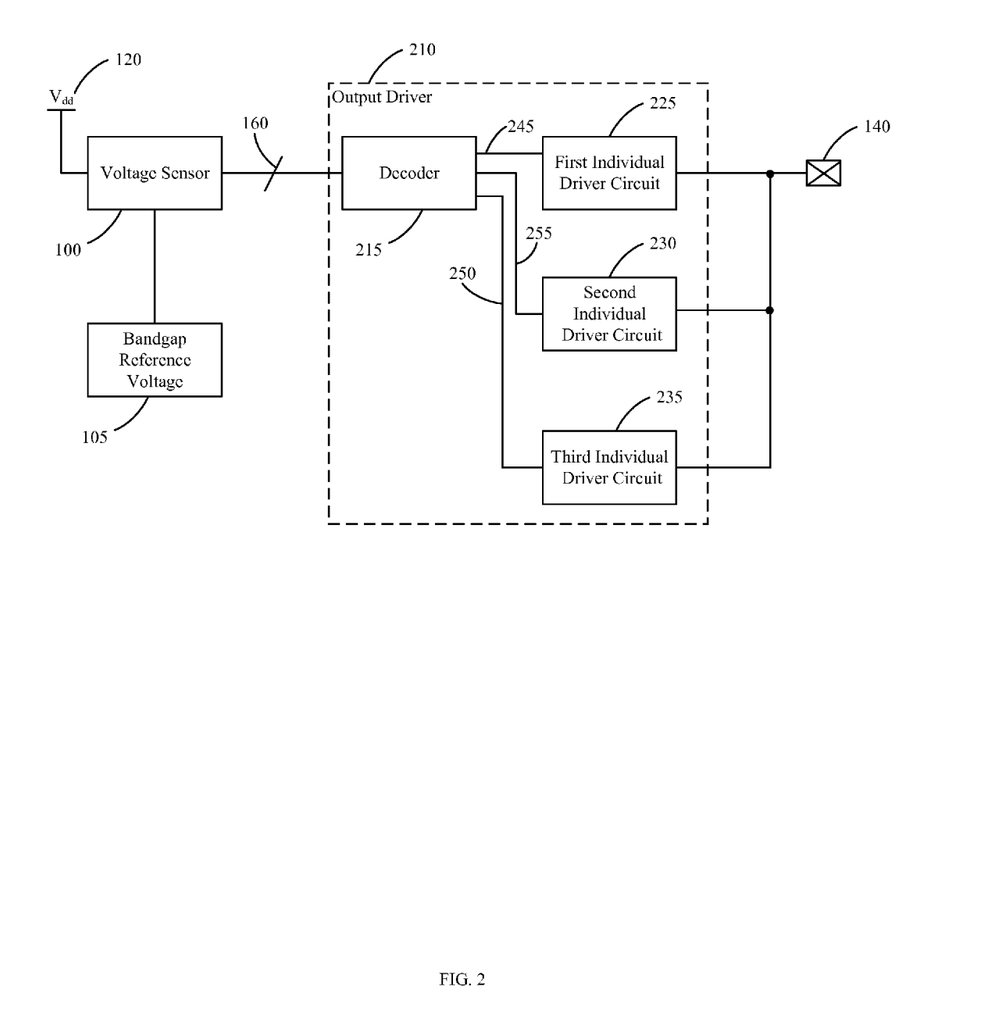
FIG. 2 is a diagrammatic view of an output driver having three individual driver circuits in accordance with an embodiment of the present invention.

With reference to FIG. 2, in an exemplary embodiment, the output driver 210 may be implemented in a LVCMOS integrated circuit design, wherein the supply voltage levels may be 3.3V, 2.5V or 1.8V. In this embodiment, the output driver 210 includes a first individual driver circuit 225, a second individual driver circuit 230 and a third individual driver circuit 235 that are coupled to the decoder through individual outputs 245, 255, 250, respectively. As previously described, the output impedance for the each of the individual driver circuits 225, 230, 235 is known for each of the supply voltage levels of 3.3V, 2.5V and 1.8V. Based upon the predetermined output impedances for each of the individual driver circuits 225, 230, 235, it is assumed that the output impedance of the first individual driver circuit 225, when operating at a 3.3V supply voltage, provides the desired constant output impedance from the output driver 210. It follows that, as the supply voltage 120 is reduced to 2.5V and 1.8V, the output impedance of the first individual driver circuit 225 is also reduced.

In operation, when the output driver 210 is implemented in a circuit design operating at a supply voltage 120 of 3.3V, the digital codeword 160, generated by the voltage sensor 110 indicating a supply voltage 120 of 3.3V, is used by the decoder 215 to activate the first individual driver circuit 235 through individual output 245. In this embodiment, activation of the first individual driver circuit 235 provides the desired output impedance from the output driver 210 to the transmission line.

Alternatively, when the output driver 210 is implemented in a circuit design operating at a supply voltage 120 of 2.5V, the digital codeword 160, generated by the voltage sensor 110 indicating a supply voltage 120 of 2.5V, is used by the decoder 215 to activate both the first individual driver circuit 225 through individual output 245 and the second individual driver circuit 230 through individual output 255. In this embodiment, it is necessary to activate both the first driver circuit 225 and the second driver circuit 230 because when the supply voltage 120 is reduced to 2.5V, the output impedance of the first driver circuit 225 is also reduced and no longer provides the desired constant output impedance for the output driver 210. As such, it is necessary to activate the second individual driver circuit 230 to provide additional output impedance that is added to the output impedance of the first driver circuit 225 in order to maintain the desired constant output impedance of the output driver 210. In general, when the supply voltage 120 is reduced, the contribution of the first individual driver circuit 225 to the output impedance of the output driver 210 is reduced, requiring the activation of the second individual driver circuit 230 to contribute it's predetermined output impedance to the output impedance of the output driver 210 to maintain the constant output impedance.

Additionally, when the output driver 210 is implemented in a circuit operating at or below a supply voltage of 1.8V, the decoder will activate all of the individual driver circuits 225, 230, 235, such that each driver circuit contributes a predetermined output impedance at the specific supply voltage of 1.8V to the output impedance of the output driver 210 resulting in a constant output impedance of the output driver 210. In general, one or more of the individual driver circuits 225, 230, 235 are activated, based upon the specific supply voltage being used, thereby each activated individual driver circuit contributing a predetermined amount of output impedance to the total output impedance of the output driver 210 necessary to maintain a constant output impedance for the specific supply voltage.

In the present invention, the voltage level of the supply voltage 120 currently being used to power the output driver 210 is used to activate one or more individual driver circuits 225, 230, 235. The output impedance of each of the activated individual driver circuits 225, 230, 235 at the given supply voltage are combined to provide the total output impedance of the output driver. As such, the output impedance of the output driver 210 is adaptable to the supply voltage 120 currently being used to power the circuitry.

Figure 3:
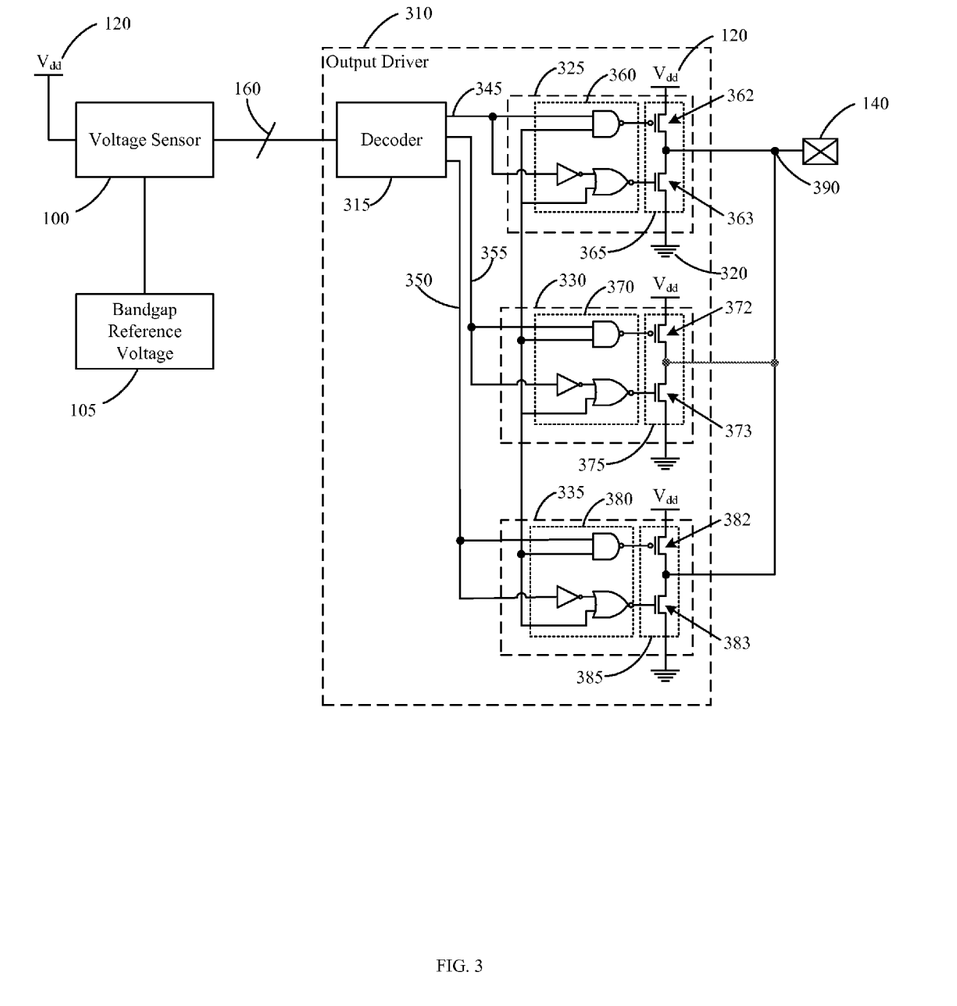
FIG. 3 is a diagrammatic view of an output driver comprising activation circuitry and driver circuitry in accordance with an embodiment of the present invention.

With reference to FIG. 3, each of the individual driver circuits 325, 330, 335 may include activation circuitry 360, 370, 380 coupled to the individual outputs of the decoder 345, 350, 355 and driver circuitry 365, 375, 385 coupled to the activation circuitry and to an output of the output driver 390. The activation circuitry 360, 370, 380 includes logic gates that are configured to activate the driver circuitry 365, 375, 385 when an activation signal is received from the decoder 315 on one or more of the individual outputs of the decoder 345, 350, 355. The driver circuitry 365, 375, 385 may include a pull-up element and a pull-down element configured in a pull-up pull-down configuration, as is commonly know in the art for transistor driver circuitry.

Figure 4:
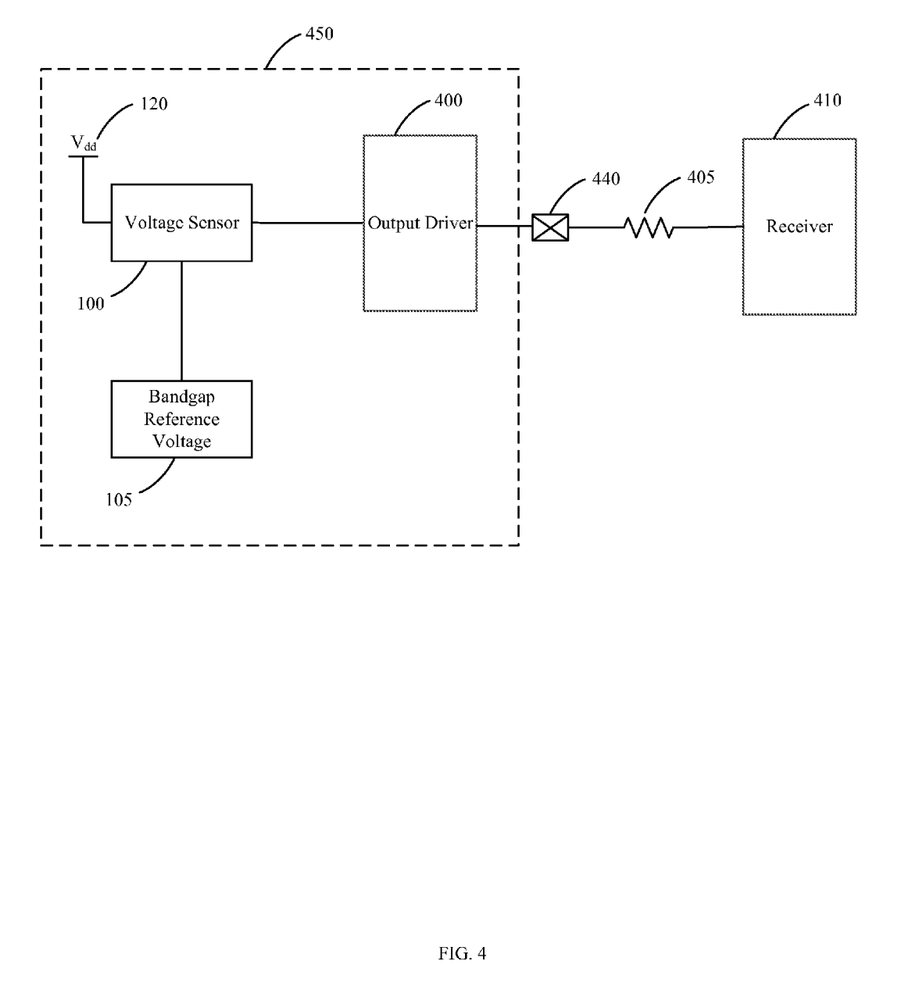
FIG. 4 is a diagrammatic view of an output driver and a corresponding receiver in accordance with an embodiment of the present invention.

With reference to FIG. 4, a device 450 for providing a constant output impedance in response to a plurality of different power supply voltage level inputs includes, a voltage sensor 100 for sensing the voltage level of a power supply 120 and for converting the voltage level to a digital codeword representative of the voltage level of the power supply 120 and providing the digital codeword to a output driver 400. As previously described, in one embodiment, the output driver 400 includes a plurality of individual driver circuits, each one of the plurality of individual driver circuits configured to provide a plurality of predetermined output impedances in response to a plurality of power supply voltage level inputs and a decoder coupled to each of the plurality of individual driver circuits and to the voltage sensor, the decoder for receiving the digital codeword from the voltage sensor, for decoding the digital codeword and for activating one or more of the individual driver circuits based upon the decoded digital codeword, the activation of the one ore more individual driver circuits to provide a constant output impedance from the output driver in response to the voltage level of the power supply coupled to the output driver, wherein the constant output impedance is a combination of the predetermined output impedances of the activated individual driver circuits.

In a specific embodiment, the digital codeword generated by the voltage sensor 100 may be stored in memory prior to being decoded by the decoder of the output driver 400. In an additional embodiment, the digital codeword generated by the voltage sensor 100 may be filtered prior to being decoded by the decoder of the output driver 400.

In operation, the output driver 400 drives data onto a transmission for receipt by a receiver 410 through a signal pad 440. In the present invention, the data is driven at a constant impedance from the output driver. In one embodiment, the constant output impedance of the output driver 400 provided by the combination of the activated individual driver circuits may match the characteristic impedance of the transmission line of a semiconductor device. Alternatively, if the constant output impedance of the output driver 400 does not match the characteristic impedance of the transmission line, an optional matching resistor 405 may be implemented within the transmission line to match the impedance of the output driver 400 to the impedance of the transmission line.

Figure 5:
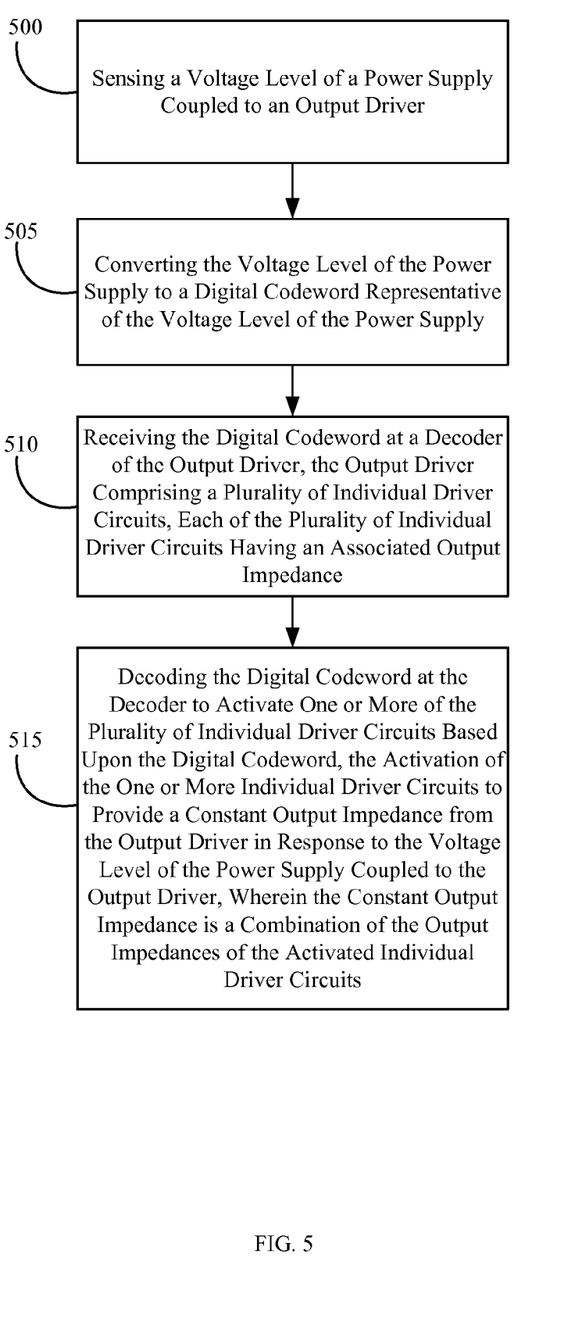
FIG. 5 is a flow diagram illustrating a method of providing a constant output impedance from an output driver in accordance with an embodiment of the present invention.

With reference to FIG. 5, in operation of the output driver 110 of FIG. 1, a method of providing a constant output impedance from the output driver 110 in response to a plurality of different power supply voltage levels includes, sensing a voltage level of a power supply coupled to an output driver 500. In one embodiment, a voltage sensor 100 coupled to the output driver 110 may be used to sense the voltage level of a power supply 120 coupled to the output driver.

After sensing the voltage level of the power supply, the method continues by converting the sensed voltage level of the power supply to a digital codeword representative of the voltage level of the power supply 505. In one embodiment, the voltage sensor 100 may convert the sensed voltage level of the power supply 120 to a digital codeword representative of the voltage level of the power supply 120 by comparing the voltage level to a reference voltage 105.

Following the generation of the digital codeword, the digital codeword is received at a decoder of the output driver, the output driver comprising a plurality of individual driver circuits each of the individual driver circuits having an associated output impedance 510. In one embodiment, the decoder 115 of the output driver 110 is coupled to the voltage sensor 100 to receive the digital codeword 160 from the voltage sensor and the output driver 100 comprises a plurality of individual driver circuits 125, 130, 135. In one embodiment, each of the plurality of individual driver circuits 125, 130, 135 are configured to provide a plurality of predetermined output impedances in response to a plurality of power supply voltage level inputs.

Following the receipt of the digital codeword at the decoder, the method continues by decoding the digital codeword at the decoder to activate one or more of the plurality of individual driver circuits based upon the decoded digital codeword, the activation of the one more individual driver circuits to provide a constant output impedance from the output driver in response to the voltage level of the power supply coupled to the output driver, wherein the constant output impedance is a combination of the output impedances of the activated individual driver circuits 515. In one embodiment, the decoder 115 decodes the digital codeword 160 and activates one or more of the plurality of individual driver circuits 125, 130, 135 to provide a constant output impedance under varying supply voltages, thereby adapting the output impedance of the output driver 110 to the voltage level of the supply voltage 120.

In various embodiments, the system of the present invention may be implemented in a Field Programmable Gate Array (FPGA) or Application Specific Integrated Circuit (ASIC) suitable for the design of encoders/decoders for LDPC codes.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. An output driver to provide a constant output impedance in response to a plurality of different power supply voltage level inputs, the output driver comprising:
    a plurality of individual driver circuits, each one of the plurality of individual driver circuits configured to provide a plurality of predetermined output impedances in response to a plurality of power supply voltage level inputs; and
    a decoder coupled to each of the plurality of individual driver circuits, the decoder for receiving a digital codeword representative of a voltage level of a power supply coupled to the output driver, the decoder for decoding the digital codeword and for activating one or more of the individual driver circuits based upon the decoded digital codeword, the activation of the one more individual driver circuits to provide a constant output impedance from the output driver in response voltage level of power supply coupled output to the output driver, wherein the constant output impedance from the driver is a summation of the predetermined output impedances of each of the activated one or more individual driver circuits.

2. An output driver to provide a constant output impedance in response to a plurality of different power supply voltage level inputs, the output driver comprising:
    a plurality of individual driver circuits, each one of the plurality of individual driver circuits configured to provide a plurality of predetermined output impedances in response to a plurality of power supply voltage level inputs, wherein each of the plurality of individual driver circuits includes activation circuitry coupled an output of the decoder, and driver circuitry coupled to the activation circuitry and to an output of the output driver; and
    a decoder coupled to each of the plurality of individual driver circuits, the decoder for receiving a digital codeword representative of a voltage level of a power supply coupled to the output driver, the decoder for decoding the digital codeword and for activating one or more of the individual driver circuits based upon the decoded digital codeword, the activation of the one more individual driver circuits to provide a constant output impedance from the output driver in response to the voltage level of the power supply coupled to the output driver, wherein the constant output impedance is a combination of the predetermined output impedances of the activated individual driver circuits.

3. The output driver of claim 2, wherein the decoder is further configured for providing an activation signal to the activation circuitry of each of the plurality of individual driver circuits based upon the decoded digital codeword.

4. The output driver of claim 2, wherein the driver circuitry of each of the plurality of individual driver circuits comprises a pull-up element and a pull-down element configured in a pull-up pull-down configuration.

5. An output driver to provide a constant output impedance in response to a plurality of different power supply voltage level inputs, the output driver comprising:
    a plurality of individual driver circuits, each one of the plurality of individual driver circuits configured to provide a plurality of predetermined output impedances in response to a plurality of power supply voltage level inputs; and
    a decoder coupled to each of the plurality of individual driver circuits, the decoder for receiving a digital codeword representative of a voltage level of a power supply coupled to the output driver, the decoder for decoding the digital codeword and for activating one or more of the individual driver circuits based upon the decoded digital codeword, the activation of the one more individual driver circuits to provide a constant output impedance from the output driver in response to the voltage level of the power supply coupled to the output driver, wherein the constant output impedance is a combination of the predetermined output impedances of the activated individual driver circuits, and wherein the output driver is an element of a semiconductor device and the output driver is configured to transmit a signal on a transmission line of the semiconductor device, and wherein the transmission line has a characteristic impedance.

6. The output driver of claim 2, wherein the constant output impedance of the output driver substantially matches the characteristic impedance of the transmission line of the semiconductor device.

7. A device for providing a constant output impedance in response to a plurality of different power supply voltage level inputs, the device comprising:
  a voltage sensor for sensing the voltage level of a power supply coupled to the voltage sensor and for converting the voltage level to a digital codeword representative of the voltage level of the power supply;
  an output driver coupled to the voltage sensor, the output driver comprising;
    a plurality of individual driver circuits, each one of the plurality of individual driver circuits configured to provide a plurality of predetermined output impedances in response to a plurality of power supply voltage level inputs; and
    a decoder coupled to each of the plurality of individual driver circuits and to the voltage sensor, the decoder for receiving the digital codeword from the voltage sensor, for decoding the digital codeword and for activating one or more of the individual driver circuits based upon the decoded digital codeword, the activation of the one more individual driver circuits to provide a constant output impedance from the output driver in response to the voltage level of the power supply coupled to the output driver, wherein the constant output impedance from the output driver is a summation of the predetermined output impedances of each of the activated one or more individual driver circuits.

8. A device for providing a constant output impedance in response to a plurality of different power supply voltage level inputs, the device comprising:
  a voltage sensor for sensing the voltage level of a power supply coupled to the voltage sensor and for converting the voltage level to a digital codeword representative of the voltage level of the power supply;
  an output driver coupled to the voltage sensor, the output driver comprising;
    a plurality of individual driver circuits, each one of the plurality of individual driver circuits configured to provide a plurality of predetermined output impedances in response to a plurality of power supply voltage level inputs, wherein each of the plurality of individual driver circuits includes activation circuitry coupled to an output of the decoder, and driver circuitry coupled to the activation circuitry and to an output of the output driver; and
    a decoder coupled to each of the plurality of individual driver circuits and to the voltage sensor, the decoder for receiving the digital codeword from the voltage sensor, for decoding the digital codeword and for activating one or more of the individual driver circuits based upon the decoded digital codeword, the activation of the one more individual driver circuits to provide a constant output impedance from the output driver in response to the voltage level of the power supply coupled to the output driver, wherein the constant output impedance is a combination of the predetermined output impedances of the activated individual driver circuits.

9. The device of claim 8, wherein the decoder is further configured for providing an activation signal to the activation circuitry of each of the plurality of individual driver circuits based upon the decoded digital codeword.

10. The device of claim 8, wherein the driver circuitry of each of the plurality of individual driver circuits comprises a pull-up element and a pull-down element configured in a pull-up pull-down configuration.

11. A device for providing a constant output impedance in response to a plurality of different power supply voltage level inputs, the device comprising:
  a voltage sensor for sensing the voltage level of a power supply coupled to the voltage sensor and for converting the voltage level to a digital codeword representative of the voltage level of the power supply; and
  an output driver coupled to the voltage sensor, the output driver comprising;
    a plurality of individual driver circuits, each one of the plurality of individual driver circuits configured to provide a plurality of predetermined output impedances in response to a plurality of power supply voltage level inputs; and
    a decoder coupled to each of the plurality of individual driver circuits and to the voltage sensor, the decoder for receiving the digital codeword from the voltage sensor, for decoding the digital codeword and for activating one or more of the individual driver circuits based upon the decoded digital codeword, the activation of the one more individual driver circuits to provide a constant output impedance from the output driver in response to the voltage level of the power supply coupled to the output driver, wherein the constant output impedance is a combination of the predetermined output impedances of the activated individual driver circuits, wherein the output driver is an element of a semiconductor device and the output driver is configured to transmit a signal on a transmission line of the semiconductor device, and wherein the transmission line has a characteristic impedance.

12. The device of claim 11, wherein the constant output impedance of the output driver substantially matches the characteristic impedance of the transmission line of the semiconductor device.

13. A device for providing a constant output impedance in response to a plurality of different power supply voltage level inputs, the device comprising:
  a voltage sensor for sensing the voltage level of a power supply coupled to the voltage sensor and for converting the voltage level to a digital codeword representative of the voltage level of the power supply, wherein the voltage sensor is an analog-to-digital converter; and
  an output driver coupled to the voltage sensor, the output driver comprising;
    a plurality of individual driver circuits, each one of the plurality of individual driver circuits configured to provide a plurality of predetermined output impedances in response to a plurality of power supply voltage level inputs; and
    a decoder coupled to each of the plurality of individual driver circuits and to the voltage sensor, the decoder for receiving the digital codeword from the voltage sensor, for decoding the digital codeword and for activating one or more of the individual driver circuits based upon the decoded digital codeword, the activation of the one more individual driver circuits to provide a constant output impedance from the output driver in response to the voltage level of the power supply coupled to the output driver, wherein the constant output impedance is a combination of the predetermined output impedances of the activated individual driver circuits.

14. A device for providing a constant output impedance in response to a plurality of different power supply voltage level inputs, the device comprising:
   a voltage sensor for sensing the voltage level of a power supply coupled to the voltage sensor and for converting the voltage level to a digital codeword representative of the voltage level of the power supply, wherein converting the voltage level to a digital codeword representative of the voltage level of the power supply further includes comparing the voltage level of the power supply to a reference voltage; and
   an output driver coupled to the voltage sensor, the output driver comprising;
      a plurality of individual driver circuits, each one of the plurality of individual driver circuits configured to provide a plurality of predetermined output impedances in response to a plurality of power supply voltage level inputs; and
      a decoder coupled to each of the plurality of individual driver circuits and to the voltage sensor, the decoder for receiving the digital codeword from the voltage sensor, for decoding the digital codeword and for activating one or more of the individual driver circuits based upon the decoded digital codeword, the activation of the one more individual driver circuits to provide a constant output impedance from the output driver in response to the voltage level of the power supply coupled to the output driver, wherein the constant output impedance is a combination of the predetermined output impedances of the activated individual driver circuits.

15. The device of claim 14, wherein the reference voltage is a bandgap reference voltage.

16. A method of providing a constant output impedance of an output driver in response to a plurality of different power supply voltage levels, the method comprising;
   sensing a voltage level of a power supply coupled to an output driver;
   converting the voltage level of the power supply to a digital codeword representative of the voltage level of the power supply;
   receiving the digital codeword at a decoder of the output driver, the output driver comprising a plurality of individual driver circuits, wherein each of the plurality of individual driver circuits are configured to provide a plurality of predetermined output impedances in response to a plurality of power supply voltage level inputs; and
   decoding the digital codeword at the decoder to activate one or more of the plurality of individual driver circuits based upon the decoded digital codeword, the activation of the one more individual driver circuits to provide a constant output impedance from the output driver in response to the voltage level of the power supply coupled to the output driver, wherein the constant output impedance from the output driver is a summation of the predetermined output impedances of each of the activated one or more individual driver circuits.

* * * * *